United States Patent [19]

Kawashima et al.

[11] 4,399,463
[45] Aug. 16, 1983

[54] SIGNAL DETECTOR CIRCUIT

[75] Inventors: Kazumi Kawashima, Takatsuki; Masaaki Fujita, Ibaraki, both of Japan

[73] Assignee: Matsushita Electric Industrial Co., Ltd., Osaka, Japan

[21] Appl. No.: 315,455

[22] Filed: Oct. 27, 1981

[30] Foreign Application Priority Data

Oct. 29, 1980 [JP] Japan .................. 55-152915

[51] Int. Cl.³ .............................................. H04N 5/50
[52] U.S. Cl. .............................. 358/191.1; 358/193.1; 358/195.1
[58] Field of Search ............... 358/191.1, 192.1, 193.1, 358/195.1; 455/159, 180, 182, 183, 184, 186, 164, 165, 192

[56] References Cited

U.S. PATENT DOCUMENTS 4,249,256 2/1981 Molinari ........................... 358/191.1
4,280,140 7/1981 Skerlos ............................. 358/195.1
4,303,944 12/1981 Kitamura ........................ 358/191.1

Primary Examiner—Michael A. Masinick
Attorney, Agent, or Firm—Stevens, Davis, Miller & Mosher

[57] ABSTRACT

A circuit for detecting the presence or absence of a television receiving signal is disclosed, wherein a detection output for automatic frequency control is compared with first to fifth levels. A low-level output is produced when the detection output is lower than the fifth level; an intermediate-level output is produced when the detection output is between the fifth and fourth levels; a low-level output is produced when the detection output is between the third and second levels; an intermediate-level output is produced when the detection output is between the second and first levels; and a high-level output is produced when the detection output is higher than the first level, thus producing an output signal of three-digit level from a single output terminal.

2 Claims, 8 Drawing Figures

SIGNAL DETECTOR CIRCUIT

The present invention relates to a signal detector circuit for a tuning device of automatic search type for television receivers, more in particular to a circuit for detecting a receiving condition of a broadcast signal by use of a detection signal for automatic frequency control (frequency discrimination signal).

In a tuning device of automatic search type, the locally oscillated frequency is changed with time so that the receiving frequency is swept, and when a particular signal is received at the time when a predetermined broadcast signal frequency is reached, the frequency sweeping is stopped thereby to continuously receive the particular frequency. In this case, it is required to detect whether or not the receiving frequency accurately coincides with the frequency of the broadcast signal to attain the proper receiving state.

The features of the present invention will become apparent when reading the following detailed description of the prior art and the present invention in conjunction with the accompanying drawings, in which.

Figure 1:
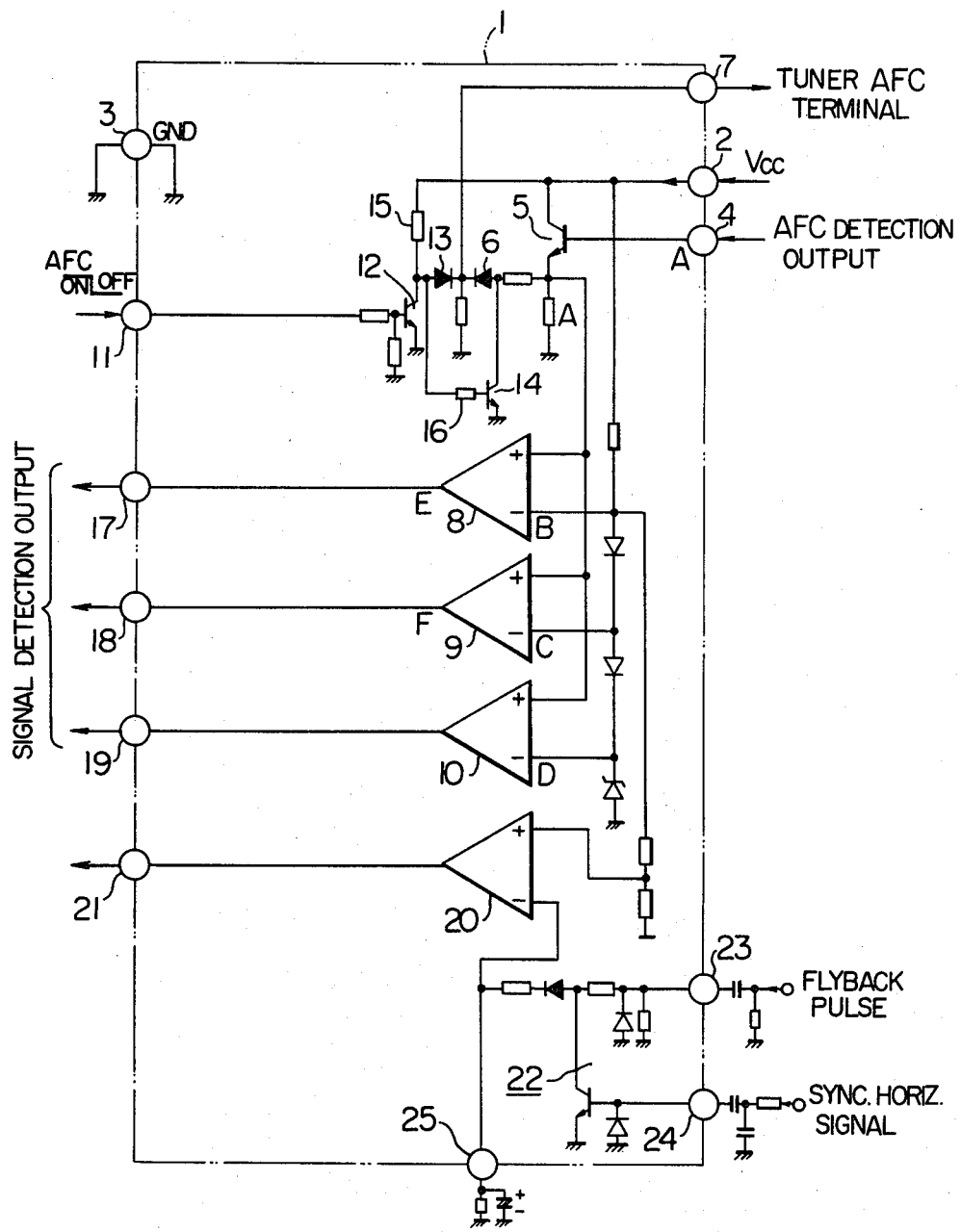
FIG. 1 is a diagram showing a conventional signal detector circuit.

First, a conventional signal detector circuit will be described with reference to FIG. 1. In FIG. 1, reference numeral 1 designates an integrated circuit element (hereinafter referred to as IC) for the detector circuit, numeral 2 a source voltage supply terminal thereof, and numeral 3 a grounding terminal. An AFC detection output A (S curve output) for automatic frequency control for the television receiver is applied to an input terminal 4. This signal is subjected to an impedance conversion through an emitter-follower made up of a transistor 5, and produced through a diode 6 to a terminal 7 for supplying to the tuner AFC circuit on the one hand and applied to level converters (voltage comparators) 8, 9 and 10 on the other hand.

A terminal 11 is applied with an input signal for turning on and off the AFC operation. When "AFC is turned off", it means that a fixed voltage of 6.5 V is applied to the AFC voltage supply terminal for the tuner, and when the "AFC is turned on", it means that the AFC detection output from the input terminal 4 is transmitted to the AFC voltage supply terminal 7 for the tuner. Assume that the input to the terminal 11 is at high level. A transistor 12 is conducting, a diode 13 is cut off, and a transistor 14 is cut off. Therefore, the diode 6 is conducting, so that the AFC detection output supplied from the terminal 4 makes up the output of the emitter-follower and is produced at the terminal 7 through the diode 6. This is the state of AFC turned on. When the terminal 11 is at low level, on the other hand, the transistor 12 is cut off and the transistor 14 is conducting, so that the diode 6 is cut off while the diode 13 is conducting. In other words, the fixed voltage of about 6.5 V divided by resistors 15 and 16 and the base-emitter voltage of the transistor 14 is produced at the terminal 7 for the tuner through the diode 13. This is the state of the "AFC turned off".

Figure 2:
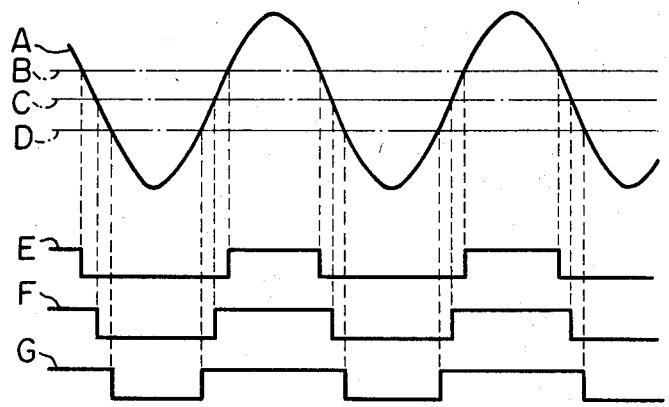
FIG. 2 is a time chart for explaining the operation thereof.

An AFC detection output A is applied to the + input terminal of each of the level comparators 8, 9 and 10, so that reference voltages B, C and D are applied to the − input terminals thereof. It is here assumed that B, C and D are approximately 7.20 V, 6.50 V and 5.80 V respectively. As a result, the comparators 8, 9 and 10 produce outputs E, F and G respectively as shown in FIG. 2 at output terminals 17, 18 and 19.

A circuit 22 for discriminating the presence or absence of a television signal will be described specifically later and will not be explained here in detail. The circuit 22 used an integrator circuit connected to a terminal 25 and the signal input to terminals 23 and 24, in such a manner that in the presence of a television signal, the comparator 20 produces a signal of low level, whereas in the absence of a television signal, the comparator 20 produces a signal of high level at the terminal 21.

As described above, the conventional circuits comprising integrated circuits require pins in a greater number of 12, thus requiring a DIL (dual in line) package.

Accordingly, it is a principal object of the present invention to provide a circuit using a reduced number of pins.

In the prior art circuits, four signal detection output terminals are required, whereas according to the present invention using a tristate, only one signal output terminal is required while at the same time making the interface with external circuits more stable and accurate. The center level concerns the case in which the output W or the signal (i) changes from low to high or high to low. At the time of change from high to low to intermediate to low, (M=intermediate level), the AFC detection output is lower than the fifth level L, while at the time of level change from low to high to intermediate to high, the AFC detection output is higher than the first level H. This fact can be easily discriminated by the microcomputer or the like.

According to the present invention, the employment of integrated circuits is made possible by reducing the number of pins on the one hand, and the signal detection is facilitated through the interface on the other hand.

Figure 5:
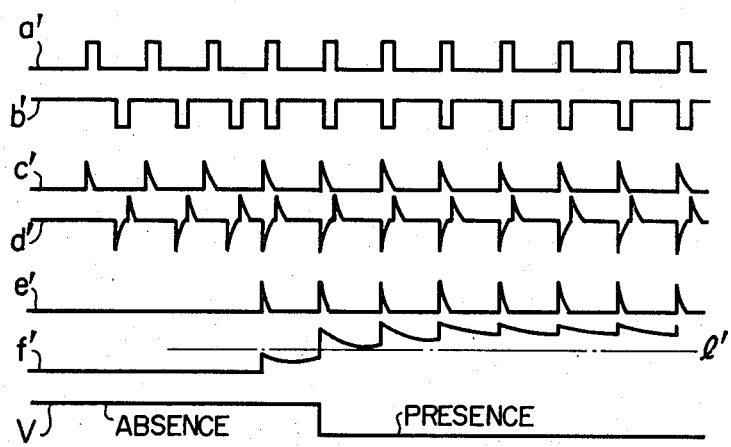
FIGS. 4 and 5 are time charts for explaining the operation of the circuit of FIG. 3.
Figure 3:
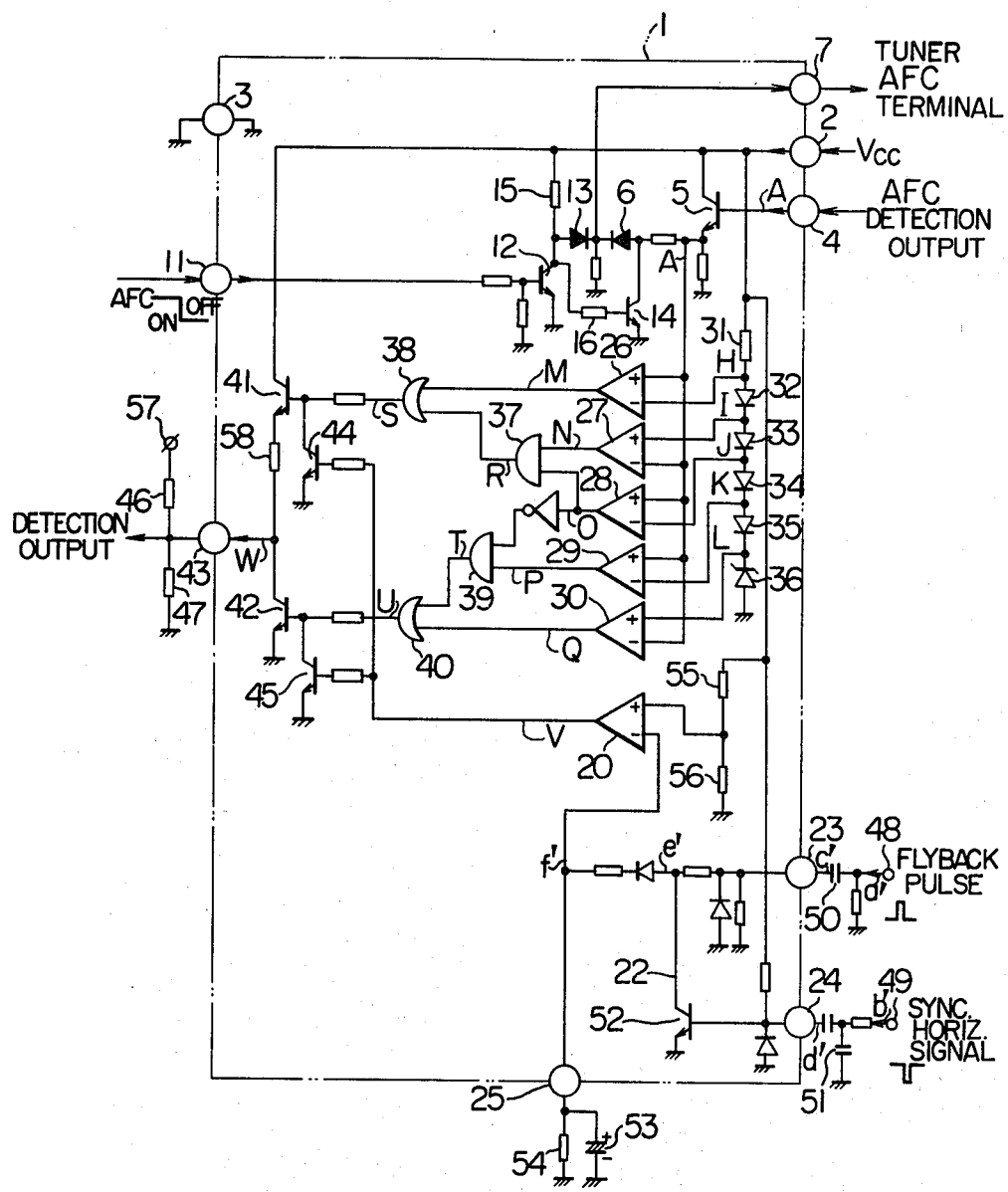
FIG. 3 is a diagram showing a signal detector circuit proposed prior to the present invention.
Figure 4:
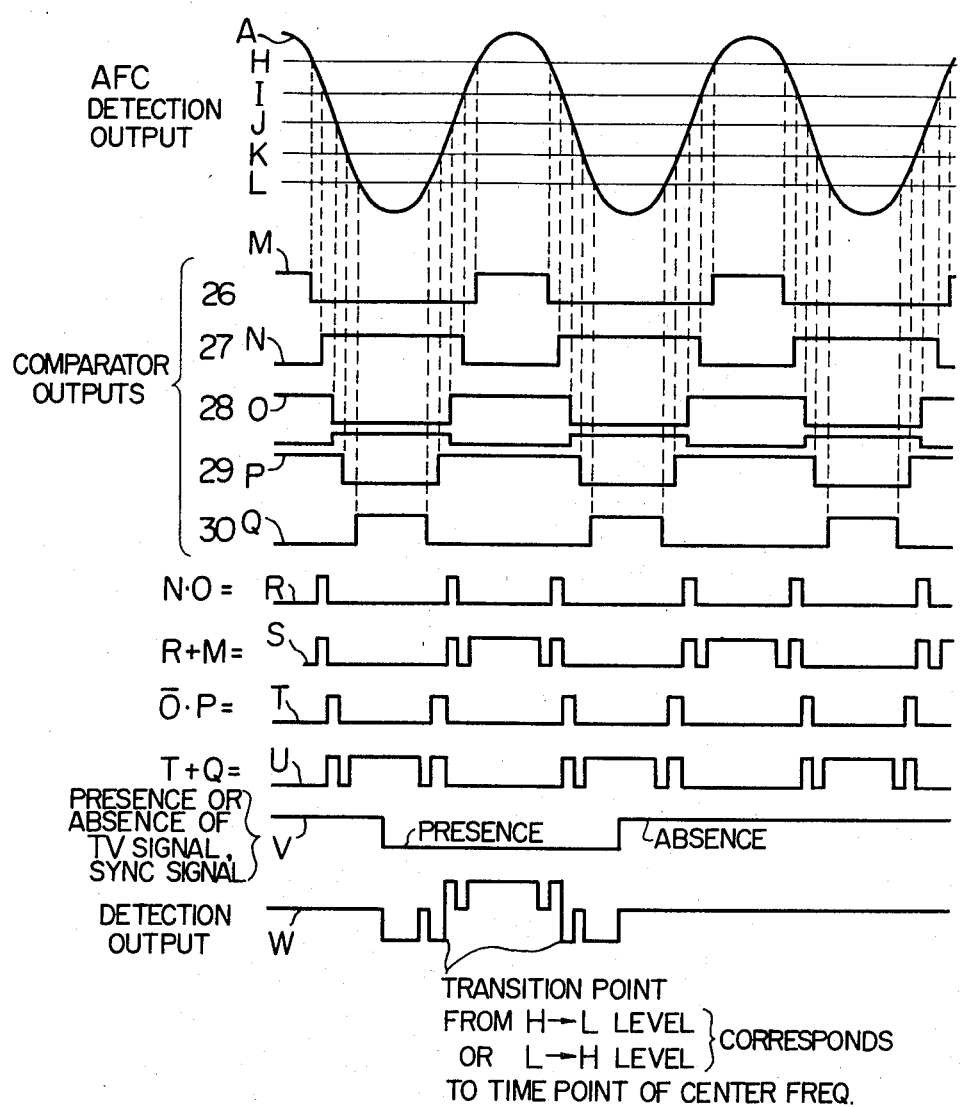

A previously proposed signal detector circuit is shown in FIG. 3, and waveforms produced at various parts thereof are shown in FIGS. 4 and 5 respectively.

The circuit of FIG. 3 uses nine pins, and the SIL (single in line) package thereof is possible when employing integrated circuits, thus reducing the cost considerably. The parts concerning the AFC on and off are identical to those in the conventional circuits and are denoted by the same reference numerals without being explained.

In this circuit, the AFC detection output A is applied to five comparators 26 to 30 thus providing one input for comparison at five levels with the input supplied on the other side in the form of first to fifth reference voltages H, I, J, K and L. Assume that a value of H is determined to be about 7.9 V, a value of I about 7.2 V, a value of J about 6.5 V, a value of K about 5.8 V and a value of L about 5.1 V through a resistor 31 and diodes 32 to 36. A comparator 26 produces an output waveform M as shown in FIG. 4, and a comparator 27 produces an output waveform N as shown in the same drawing. Also, a comparator 28 produces an output O.

The outputs N and O are applied to an AND gate 37 thereby to produce an output R therefrom. A comparator 29, on the other hand, produces an output P. The reversed output of the signal O and the output P are applied to an AND gate 39 thereby to produce an output T therefrom. The output T and the output Q of a comparator 30 are applied to an OR gate 40 thereby to produce an output U.

Assume that the presence of a television signal is detected due to a low level of the output V of the comparator 20. In the case where the output S is at high level, a transistor 41 is conducting. If the output U is at high level at this time, a transistor 42 conducts and therefore the output W to an output terminal 43 is reduced to low level, while if the output U is at low level, the output W is raised to high level. In the case where the output S is at low level, on the other hand, the transistor 41 is cut off, so that if the output U is at high level, the output W is reduced to low level, while if the output U is at low level, the output W is maintained at intermediate level. In other words, according to the waveforms of the outputs S and U, the waveform as shown by (W) in FIG. 4 is produced as a detection output. In the absence of a detection signal where the output V of the comparator 20 is at high level, by contrast, transistors 44 and 45 conduct so that the transistors 41 and 42 are cut off. Thus the output W is maintained at intermediate level, that is, the power supply is divided by external resistors 46 and 47.

A circuit for detecting the presence or absence of a television signal will be described with reference to FIG. 3 and the timing diagram of FIG. 5. Reference numeral 48 designates an input terminal for the flyback pulse a', and numeral 49 an input terminal for a horizontal synchronizing signal b'. The flyback pulse a' is differentiated by a differentiator circuit 50 which produces an output c'. The horizontal synchronizing signal b' is differentiated by a differentiator circuit 51 which produces an output d'. During the negative state of the output pulse d', a transistor 52 is temporarily cut off and the other transistors conduct. In the presence of a television signal, the horizontal synchronizing signal b' is in phase with the flyback pulse a', and therefore a detection output e' is raised to high level as shown in FIG. 5. This signal is integrated by a filter, and compared in level by the comparator 20, thus producing the detection output V. A capacitor 53 and a resistor 54 make up the filter and resistors 55 and 56 are for generating a reference voltage l'.

As described above, according to the previously proposed circuit only one signal output terminal is required by use of the output of a tristate unlike in the conventional circuits requiring four output terminals. The center level representing the receiving frequency capable of receiving the broadcast signal acurrately is such that the output W changes from low to high or high to low. At the time of change from high to low to intermediate to low (M: intermediate level), the AFC detection output is lower than the fifth level L, while at the time of change from low to high to intermediate to high, the AFC detection output is higher than the first level H. These facts are very easily detected by the microcomputer or the like.

Although the specific example of the circuit shown in FIG. 3 fulfills the principal object mentioned above, the employment of integrated circuits poses an inconvenience. Specifically, the source voltage of the power terminal 2 rarely coincides with the high level voltage of the input signal of the integrated circuit receiving the detection output signal, but in almost all cases, the interface between them is unsuccessful. In the circuit of FIG. 3, in order for the source voltage 2 of IC to coincide with the high level of the other end receiving the output signal thereof, the resistors 46 and 58 connected to a separate power supply of the power terminal 57 are used to control the high level. Nevertheless, in view of the variations of the resistance value and the voltages of the power terminals 2 and 57, the performance standers are often unsatisfied.

A circuit according to an embodiment of the present invention in which the level of the compared output, especially the high level can be secured by taking the interface into consideration will be described below.

A specific circuit example of such an embodiment will be explained with reference to FIG. 6.

The switching circuit for AFC operation and the discriminator circuit 22 for detecting the presence or absence of a television signal are identical to those mentioned above and will not be described again.

An AFC detection output A from an input terminal 4 is applied through an emitter-follower 5 to the + input of a level comparator 26, the + input of a level comparator 27, the + input of a level comparator 28, the + input of a level comparator 29 and the + input of a level comparator 30 respectively. Reference voltages H, I, J, K and L generated by diodes 32, 33, 34, 35 and a Zener diode 36 are applied to the − input of the level comparator 26, the − input of the level comparator 27, the − input of the level comaprator 28, the − input of the level comparator 29 and the − input of the level comparator 30 respectively. The reference voltages H to L from the comparators 26 to 30 are compared with the AFC detection output A, thereby producing output signals as shown in (a), (b), (c), (d) and (f) of FIG. 7 respectively.

The signals (a) and (b) are applied to a NOR gate 60, and the signals (d) and (e) are applied to another NOR gate 13. The output (f) of the NOR gate 60 and the output (h) of the NOR gate 13 are applied to an OR gate 61 for producing the signal (i). The signal (c) and the reversal (g) of signal (d) are applied to a NOR gate 64 for producing the output (j). This signal (j) and the signal (e) are applied to an OR gate 65 for producing the signal (k). The outputs (h) and (i) thus obtained are used to synthesize a three-digit output. A method of synthesizing a three-digit output will be described in simple manner with reference to FIG. 8.

Figure 6:
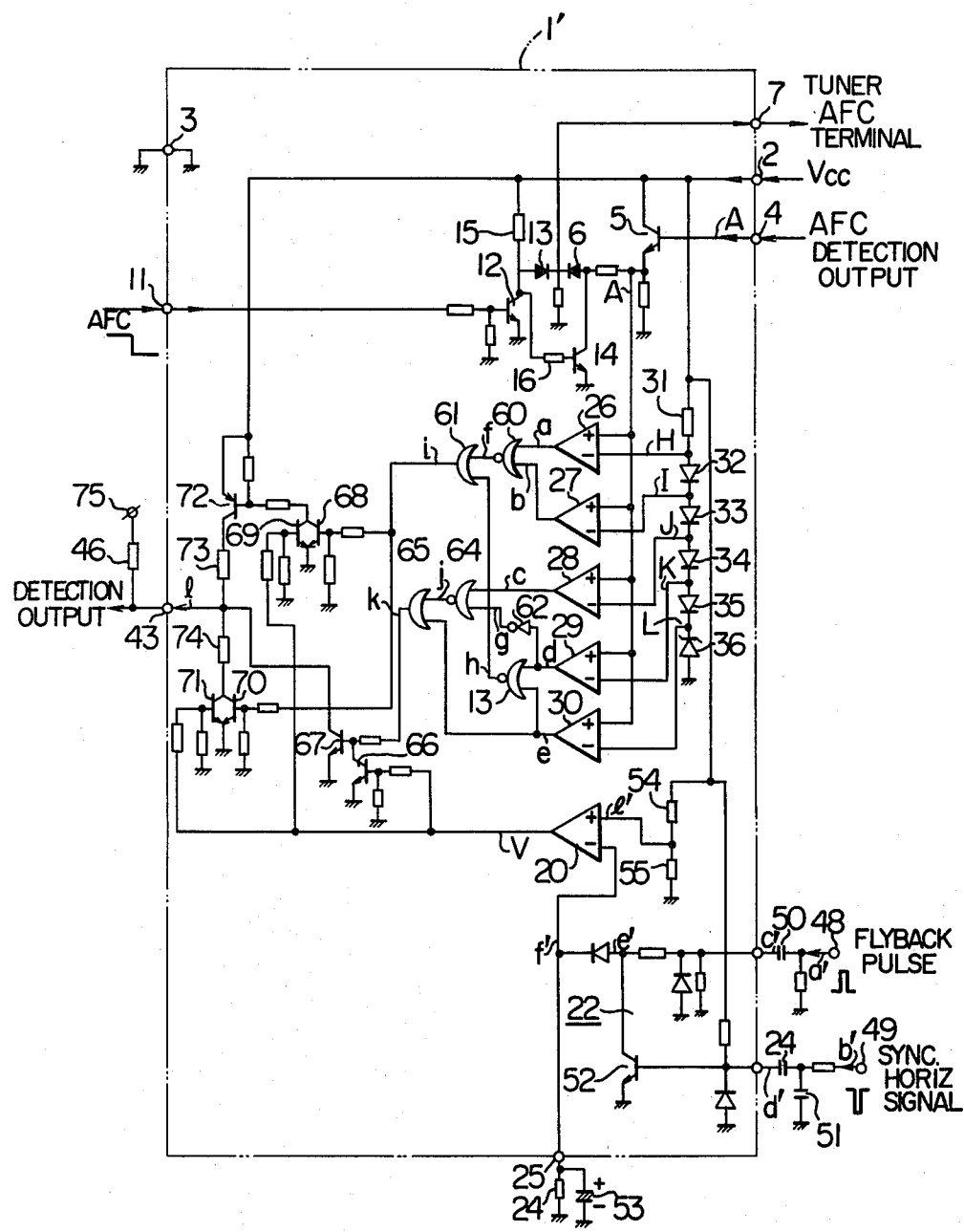
FIG. 6 is a diagram showing a signal detector circuit according to an embodiment of the present invention.
Figure 8:
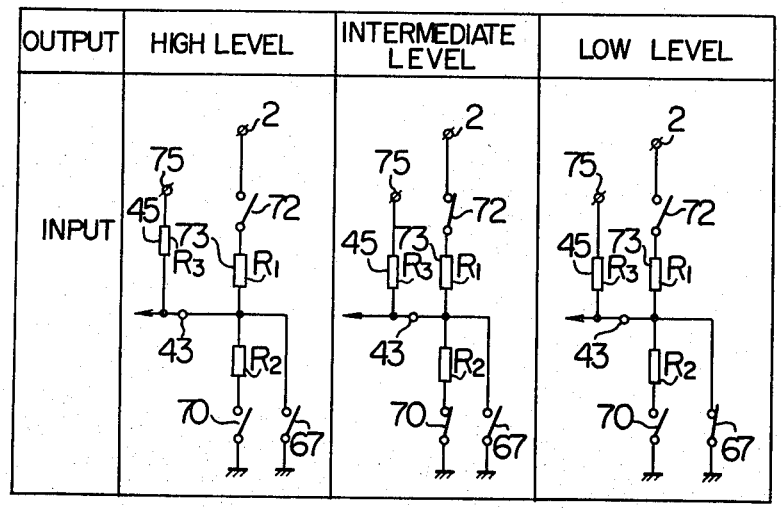
FIG. 8 is a circuit diagram for explaining the operation of the circuit shown in FIG. 6.

Switching elements of FIG. 8 are designated by numerals corresponding to those of the transistors in FIG. 6. First, in the case of producing a high level output, the switching elements take the state as shown in the left section of FIG. 8 in which switching elements 72, 70 and 67 are all open and the level at a terminal 43 is dependent solely on a voltage at a source voltage terminal 75. For attaining an intermediate level, the switching elements take the state as shown in the middle section of FIG. 8, in which the switching elements 72 and 70 are closed while the switching element 67 is open, so that the level is synthesized by resistors $R_1$, $R_2$ and $R_3$. In the case of low level, on the other hand, the switching elements assume the state as shown in the right section of FIG. 8, in which the switching elements 72 and 70 are open and the switching element 67 is closed to provide a ground level. Only in the case of the intermediate level output, both the voltages from the power source terminals 2 and 75 are influential, but if the impedance of the resistors $R_1$ and $R_2$ is designed to have a reduced value as compared with the resistance value $R_3$ of a resistor 45, the circuit is substantially free of the effect of the voltage at the source voltage terminal 75. It will be seen that in the case of the three-digit output, the opening and closing operations of the switching elements 72 and 70 are interlocked with each other.

Returning to FIG. 6, assume that there is a television signal applied. The output V of the comparator 20 is low in level and transistors 66, 69 and 71 are cut off. It will be seen from the timing diagram of FIG. 7 that both the outputs (i) and (k) are never at high level at the same time. In the case where the output (i) is at high level and the output (k) is at low level, on the other hand, a transistor 68 conducts, namely, a transistor 72 conducts, and also a transistor 70 conducts. The transistor 67 is cut off. This is the state of the middle section of FIG. 8, thus attaining the intermediate level as mentioned above.

In the case where the output (i) is at low level and the output (k) is at high level, by contrast, the transistors 68 and 70 are cut off. A transistor 72 is also cut off, while the transistor 67 conducts, thus attaining the state of the right section of FIG. 8. As a result, a low level output is produced.

When both the outputs (i) and (k) are at low level, the transistors 68, 70 and 67 are cut off. The transistor 72 is also cut off, thus attaining the state shown in the left section of FIG. 8. In this case, a high level output is produced.

Figure 7:
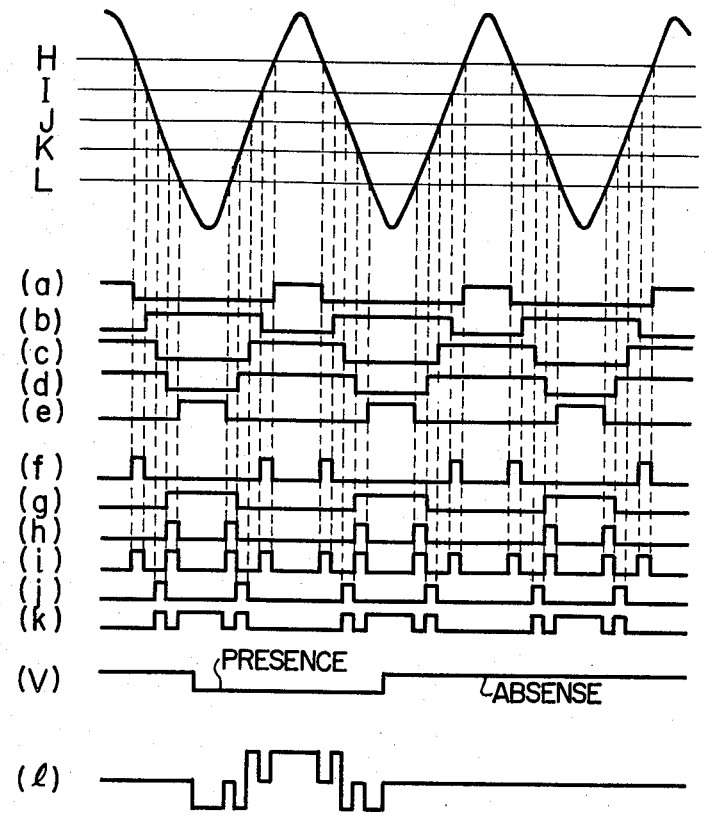
FIG. 7 is a time chart for explaining the operation of the circuit shown in FIG. 6.

In this way, a signal as shown in (l) of FIG. 7 is produced. In the absence of a television signal, the output V of the comparator 20 for signal discrimination is at high level. Therefore, the transistors 66, 69 and 71 conduct. The transistor 72 also conducts, while the transistor 67 is cut off, thus attaining the state as shown in the middle section of FIG. 8, namely, the intermediate level.

What is claimed is:

1. A signal detector circuit comprising: means for comparing a detection output for automatic frequency control with first to fifth levels respectively, wherein with a result that a low-level output is produced when said detection output is lower than said fifth level, an intermediate-level output is produced when said detection output is between said fourth and fifth levels, a low-level output is produced when said detection output is between said third and fourth levels, a high-level output is produced when said detection output is between said second and third levels, an intermediate-level output is produced when said detection output is between said first and second levels, and a high-level output is produced when said detection output is higher than said first level, an intermediate-level output being produced in the absence of a signal;
   a series circuit of a first switching element and a first resistor inserted between an output terminal and a power terminal for said comparison means;
   a third switching element connected in parallel to a series circuit of a second switching element and a second resistor, said parallel circuit being inserted between said output terminal and the ground; and
   a third resistor inserted between said output terminal and a power supply terminal of an external circuit for receiving the output of said comparator circuit,
   wherein said first, second and third switching elements being all opened when said comparing means produces said high level output, said first and second switching elements are selectively closed when said comparator circuit produces said intermediate-level output, said third switching element being selectively closed when said comparing means produces said low-level output.

2. A signal detector circuit according to claim 1, wherein a horizontal synchronizing signal extracted from a received television signal and a flyback signal are synthesized, and the synthesized output is used to detect the presence of the receiving signal, an intermediate-level output being produced in the absence of said receiving signal.

* * * * *